US010063286B2

(12) United States Patent
Endo et al.

(10) Patent No.: US 10,063,286 B2
(45) Date of Patent: Aug. 28, 2018

(54) ELECTRONIC DEVICE THAT ASSISTS WIRELESS COMMUNICATION BY A MEMORY CARD INSERTED IN A SLOT THEREOF

(71) Applicant: TOSHIBA MEMORY CORPORATION, Tokyo (JP)

(72) Inventors: Shigeto Endo, Kamakura Kanagawa (JP); Michio Ido, Yokohama Kanagawa (JP); Keisuke Sato, Yokohama Kanagawa (JP); Motochika Okano, Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/248,464

(22) Filed: Aug. 26, 2016

(65) Prior Publication Data

US 2017/0099084 A1 Apr. 6, 2017

(30) Foreign Application Priority Data

Oct. 2, 2015 (JP) ................................ 2015-196989

(51) Int. Cl.
*H04B 5/00* (2006.01)
*H04B 7/00* (2006.01)
(Continued)

(52) U.S. Cl.
CPC ....... *H04B 5/0056* (2013.01); *G06F 13/4068* (2013.01); *H04B 5/0031* (2013.01);
(Continued)

(58) Field of Classification Search
CPC .................................................... H04B 5/0056
(Continued)

(56) References Cited

U.S. PATENT DOCUMENTS 5,957,718 A * 9/1999 Cheng ................ G06K 13/0806 379/429
7,250,867 B2 7/2007 Sakama et al.
(Continued)

FOREIGN PATENT DOCUMENTS

CN 1659588 A 8/2005
CN 101577740 A 11/2009
(Continued)

OTHER PUBLICATIONS

Chinese Office Action dated Apr. 27, 2018, filed in Chinese counterpart Application No. 201610791133.4, 17 pages (with translation).

*Primary Examiner* — Tilahun B Gesesse
(74) *Attorney, Agent, or Firm* — Patterson & Sheridan, LLP

(57) ABSTRACT

An electronic device includes a main body having an aperture, a slot member disposed in the main body, the slot member having a slot exposed by the aperture and in which a memory card of a predetermined size is inserted and a connection terminal electrically connectable to a connection terminal of the memory card, and a coil disposed on a surface of the main body or within the main body so as to overlap with a surface of the slot member that is disposed to face a main surface of the memory card when the memory card is inserted in the slot.

19 Claims, 9 Drawing Sheets

2a 2a 2a 2a 2a 2a 2 14
CONTROLLER 9
11 MEMORY CONTROLLER
COMMUNICATION CONTROLLER 10
8
WIRELESS COMMUNICATION MEMORY 12
NON-VOLATILE MEMORY
VOLTAGE WAVE DETECTOR 13
7

(51) Int. Cl.
*H04B 1/38* (2015.01)
*G06F 13/40* (2006.01)
*H05K 5/02* (2006.01)

(52) U.S. Cl.
CPC ......... *H04B 5/0081* (2013.01); *H05K 5/0247* (2013.01); *H05K 5/0286* (2013.01)

(58) Field of Classification Search
USPC ........................................ 455/558, 559, 31.1
See application file for complete search history.

(56) References Cited

U.S. PATENT DOCUMENTS

| | | | | |
|---|---|---|---|---|
| 7,482,934 | B2 | 1/2009 | Nakamura et al. | |
| 8,059,628 | B2 * | 11/2011 | Bradley | A61N 1/37276 128/903 |
| 8,644,025 | B2 * | 2/2014 | Luo | G06K 19/07 361/715 |
| 8,777,113 | B2 * | 7/2014 | Huang | G06K 19/07733 235/492 |
| 9,070,956 | B2 * | 6/2015 | Kim | H01Q 1/243 |
| 9,269,038 | B2 | 2/2016 | Ikemoto et al. | |
| 9,582,693 | B2 | 2/2017 | Yosui et al. | |
| 9,633,300 | B2 * | 4/2017 | Wang | H04B 5/0056 |
| 9,954,396 | B2 | 4/2018 | Hidaka et al. | |
| 2005/0221853 | A1 * | 10/2005 | Silvester | G06F 21/35 455/551 |
| 2006/0079283 | A1 * | 4/2006 | Kim | H04B 1/3816 455/558 |
| 2006/0163364 | A1 | 7/2006 | Sakamura et al. | |
| 2007/0252706 | A1 | 11/2007 | Furutani | |
| 2009/0061933 | A1 * | 3/2009 | Lo | H04B 1/3816 455/558 |
| 2013/0267274 | A1 * | 10/2013 | Hsu | H04M 1/026 455/556.1 |
| 2014/0226293 | A1 | 8/2014 | Sato | |
| 2014/0246504 | A1 | 9/2014 | Ikemoto et al. | |
| 2015/0333796 | A1 * | 11/2015 | Riseborough | G06K 7/0008 455/41.1 |

FOREIGN PATENT DOCUMENTS

| | | | |
|---|---|---|---|
| CN | 201388229 | Y | 1/2010 |
| CN | 102663475 | A | 9/2012 |
| CN | 103748765 | A | 4/2014 |
| EP | 2746987 | A1 | 6/2014 |
| JP | 2005210676 | A | 8/2005 |
| JP | 4667397 | B2 | 4/2011 |
| JP | 2014154777 | A | 8/2014 |
| JP | WO2013183552 | A1 | 1/2016 |
| WO | 2006075359 | A1 | 7/2006 |

* cited by examiner 1
6
5c
5a
5g
5e
5
5a
5a
5a
5a
5a
5b
5d
5f
2
≥ 20mm
2b
D2
D1

15
16
5c
5a
5a
5a
5a
5a
5a
5
5e
2
5f
D2
D1

ELECTRONIC DEVICE THAT ASSISTS WIRELESS COMMUNICATION BY A MEMORY CARD INSERTED IN A SLOT THEREOF

CROSS-REFERENCE TO RELATED APPLICATION

This application is based upon and claims the benefit of priority from Japanese Patent Application No. 2015-196989, filed Oct. 2, 2015, the entire contents of which are incorporated herein by reference.

FIELD

Embodiments described herein relate generally to an electronic device, in particular an electronic device that assists wireless communication by a memory card inserted in a slot thereof.

BACKGROUND

There are many types of electronic devices that include a memory card slot device in which a memory card can be connected. When a memory card is mounted in the memory card slot device, the electronic device is capable of storing data in and reading data from the memory card.

DETAILED DESCRIPTION

An embodiment provides a memory card slot device and an electronic device has a longer range of wireless communication with a memory card having a wireless communication function.

According to an embodiment, an electronic device includes a main body having an aperture, a slot member disposed in the main body, the slot member having a slot exposed by the aperture and in which a memory card of a predetermined size is inserted and a connection terminal electrically connectable to a connection terminal of the memory card, and a coil disposed on a surface of the main body or within the main body so as to overlap with a surface of the slot member that is disposed to face a main surface of the memory card when the memory card is inserted in the slot.

Hereinafter, embodiments will be described with reference to the drawings. In the description below, the same signs are used for functions and elements which are substantially or essentially the same, and duplicate explanation will only be provided when necessary.

(First Embodiment)

A device according to the present embodiment includes a memory card slot device (hereinafter, slot device) that can hold a memory card having a wireless communication function (hereinafter, memory card).

Figure 1:
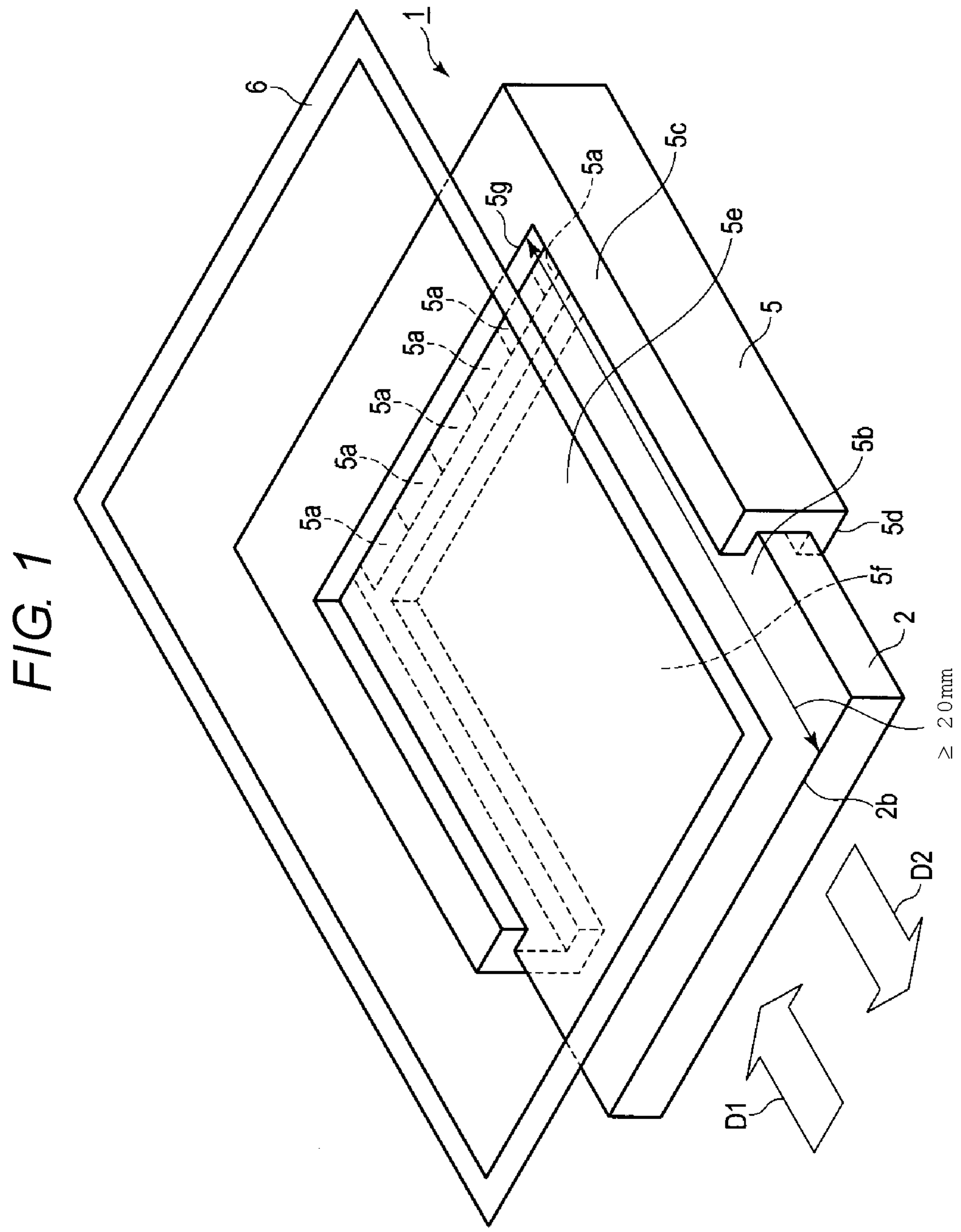
FIG. 1 is a perspective diagram of a memory card slot device according to a first embodiment.

FIG. 1 is a perspective diagram of components of a slot device 1 according to the present embodiment. FIG. 1 exemplifies a state in which a memory card 2 is inserted in the slot device 1.

Figure 2:
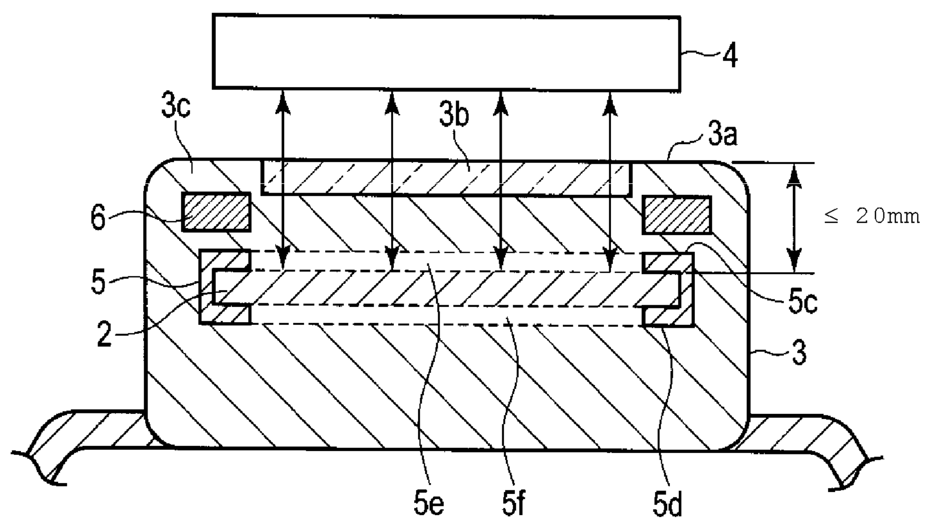
FIG. 2 is a cross-sectional diagram of an electronic device which includes the memory card slot device according to the first embodiment.

FIG. 2 is a cross-sectional diagram of an electronic device 3 which includes the slot device 1 according to the present embodiment. FIG. 2 illustrates a cross section which is perpendicular to an insertion direction D1 and a pull-out (removal) direction D2 of the memory card 2 (See FIG. 1).

Hereinafter, the slot device 1 will be described with reference to FIGS. 1 and 2.

In the present embodiment, the electronic device 3 may be a smart watch, a toy, a game console, a mobile phone, an information processing device, a wearable terminal, a digital camera, or the like. The toy may be a clock-shaped toy, for example.

The memory card 2 held in the slot device 1 and an information processing device 4 are capable of transmitting and receiving data therebetween when the information processing device 4 is close to in contact with a surface 3*a* (for example, a main surface or a top surface) of the electronic device 3 (i.e., when the memory card 2 is within a communication range of the information processing device 4). In the present embodiment, the surface 3*a* is a surface near which the information processing device 4 is brought when the information processing device 4 performs wireless communication with the memory card 2.

The information processing device 4 may be a smart watch, a toy, a game console, a mobile phone, an information processing device, a wearable terminal, a station device, or the like, for example. A station device is a communication device which is located in a shopping mall, an electronics store, a toy store, or the like, such as a kiosk.

The memory card 2 is capable of transmitting data stored in the memory card 2 to the information processing device 4 by wireless communication. The memory card 2 receives data from the information processing device 4 by wireless communication and stores the received data.

In the present embodiment, the memory card 2 performs wireless communication based on a near field communication (NFC), which is a proximal wireless communication standard at a frequency such as 13.56 MHz, for example. However, the wireless communication by the memory card 2 may be another wireless communication such as a wireless local area network (LAN), for example. The NFC enables communication at lower power than a general wireless LAN. Detailed description of the memory card 2 will be made hereinafter with reference to FIG. 3.

The slot device 1 provided in the electronic device 3 includes a memory card slot 5 (hereinafter, slot), slot connection terminals 5*a*, and a boost coil 6.

The memory card 2 which includes the wireless communication function is detached from or attached to the slot 5. When the memory card 2 is attached to the slot 5, the slot connection terminals 5*a* of the slot 5 are electrically connected to the connection terminals 2*a* (See FIG. 3) of the memory card 2. As a result, the electronic device 3 which includes the slot device 1 is capable of storing data in the memory card 2 and reading data from the memory card 2. The slot connection terminals 5*a* are formed on an innermost surface of the slot 5 in the insertion direction D1.

The slot 5 includes an insertion port 5*b* from which the memory card 2 is inserted. The slot connection terminals 5*a* is opposite to the insertion port 5*b*.

The slot 5 also includes a first main surface 5*c* and a second main surface 5*d* which faces the first main surface 5*c*. The first main surface 5*c* includes an opening region 5*e*. The second main surface 5*d* may include an opening region 5*f* as shown in FIG. 1. In the present embodiment, the opening regions 5*e* and 5*f* are rectangular. However, the opening regions 5*e* and 5*f* may have any shape through which magnetic flux can pass, such as a fan-shaped, a semicircular shape, an elliptical shape, a triangular shape, or the like.

In the present embodiment, the memory card 2 is plate-shaped. The first main surface 5*c* and the second main surface 5*d* are surfaces which are parallel to a surface having the greatest surface area of the plate-shaped memory card 2. In the present embodiment, for example, the first main surface 5*c* of the slot 5 is a surface which has the shortest distance to the surface 3*a* of the electronic device 3 among the two surfaces of the slot 5 which face the surface 3*a* of the electronic device 3. For example, the second main surface 5*d* of the slot 5 has the longest distance to the surface 3*a* of the electronic device 3 among the two surfaces of the slot 5 which face the surface 3*a* of the electronic device 3.

In the present embodiment, an end portion 2*b* is an end portion of the memory card 2 in the pull-out direction D2. An end portion 5*g* is an end of the opening region 5*e* in the pull-out direction D2.

In the present embodiment, in the opening region 5*e* of the first main surface 5*c*, a distance between the end portion 2*b* and the end portion 5*g* is greater than or equal to 20 mm. In other words, the slot 5 is shaped such that a region greater than or equal to 20 mm is open in the first main surface 5*c* from the end portion 2*b* of the memory card 2. The distance between the end portion 2*b* and the end portion 5*g* may be at least partially smaller than 20 mm as long as the wireless communication performance is not disturbed.

The opening region 5*f* of the second main surface 5*d* may be formed in the same manner as the opening region 5*e* of the first main surface 5*c*.

For example, the distance between an inner most end of the opening region 5*e* and the insertion port 5*b* may be greater than or equal to 20 mm.

For example, the slot 5 may be formed of a non-metal material or a highly magnetically permeable material. The slot 5 may be formed of a non-magnetic material. As a specific example, the slot 5 is formed of a bake material.

In the slot 5, at least the first main surface 5*c* and the second main surface 5*d* are formed of a non-metal material, a highly magnetically permeable material, or a non-magnetic material, and the side surfaces of the slot 5 may be formed of a low magnetically permeable material or a magnetic material.

In the slot device 1, by forming the opening region 5*e* in the first main surface 5*c*, and forming the opening region 5*f* in the second main surface 5*d*, if necessary, the slot 5 does not impede the magnetic field generated by the memory card 2 in the slot 5, and does not impede electromagnetic waves from the memory card 2 or electromagnetic waves transmitted to the memory card 2.

The slot device 1 includes the boost coil 6 between the surface 3*a* of the electronic device 3 and the slot 5. Alternatively, the slot device 1 may include the boost coil 6 on the surface 3*a* of the electronic device 3. The boost coil 6 may be bonded to the slot device 1 as in a second embodiment (See FIG. 9).

The boost coil 6 faces the first main surface 5*c* of the slot 5 and amplifies the strength of electromagnetic waves which are transmitted or received by the memory card 2 which is mounted in the slot 5. The boost coil 6 is ring shaped or spiral shaped, for example. The boost coil 6 extends a distance of wireless communication between the memory card 2 mounted in the slot 5 and the information processing device 4. For example, when the electronic device 3 is a watch-type device, the boost coil 6 is arranged under a transparent plate 3*b* which covers a faceplate of a main body, or is arranged on a circular circumferential portion 3*c* which supports the transparent plate 3*b*.

The slot 5 is arranged at a predetermined distance from the surface 3*a* of the electronic device 3 such that the memory card 2 is capable of performing wireless communication with the information processing device 4. The greater the opening size of the slot 5, the longer the distance between the surface 3*a* of the electronic device 3 and the slot 5 can be. The longer the boost coil 6 extends the communication range, the longer the distance between the surface 3*a* of the electronic device 3 and the slot 5 can be.

For example, the slot device 1 is arranged in the electronic device 3 such that the distance between the surface 3*a* of the electronic device 3 and the memory card 2 mounted in the slot 5 is 20 mm or less.

Figure 3:
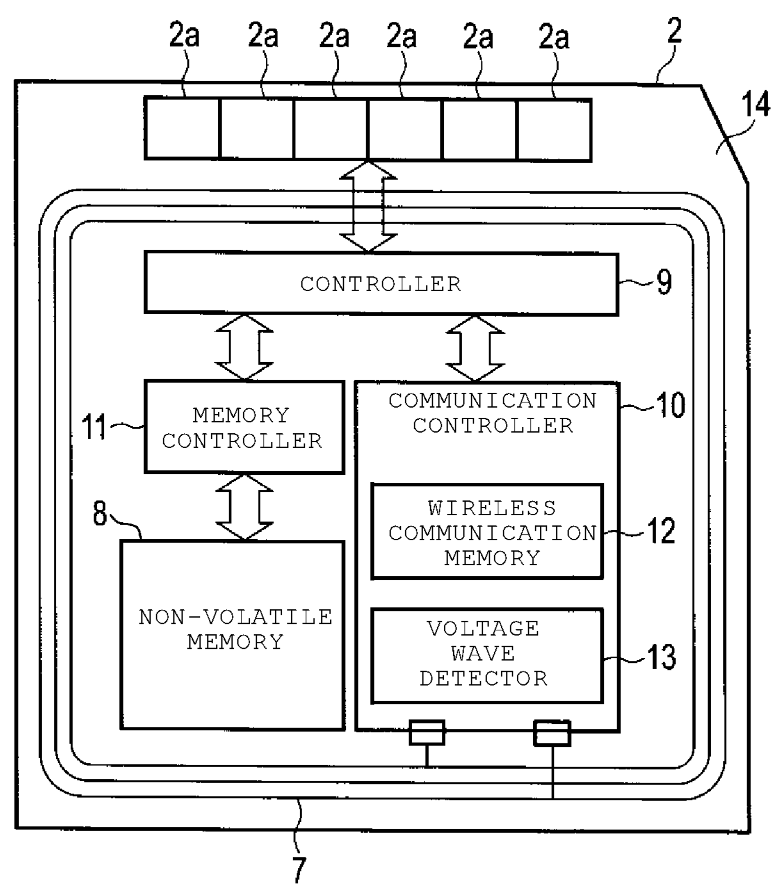
FIG. 3 is a block diagram of a memory card which has a wireless communication function.

FIG. 3 is a block diagram of the memory card 2, which has the wireless communication function.

When the memory card 2 is mounted in the slot device 1, the memory card 2 is electrically connected to the electronic device 3 and receives power supplied from the electronic device 3. The memory card 2 has a function of storing data received from the electronic device 3, and a function of transmitting read data to the electronic device 3. Even if the memory card 2 does not receive power from the electronic device 3, the memory card 2 has a function of communicating data using power generated (induced) through the electromagnetic induction of a wireless antenna 7. In other words, the memory card 2 can perform wireless communication, and can transmit data to or receive data from the information processing device 4. Even if the memory card 2 does not receive power from the electronic device 3, at least part of the memory card 2 is capable of operating using the power generated by electromagnetic induction based on the electromagnetic waves from the information processing device 4.

In the present embodiment, the memory card 2 transmits data to and receives data from the electronic device 3 according to a wired interface such as an SD interface, for example. However, another interface may be used. The memory card 2 transmits data to and receives data from the information processing device 4 using an NFC interface, for example. However, another wireless communication interface may be used.

The memory card 2 includes the wireless antenna 7, a non-volatile memory 8, a controller 9, a communication controller 10, a memory controller 11, and connection terminals 2*a*. The communication controller 10 includes a wireless communication memory 12 and a voltage wave detector 13. The communication controller 10 and the wireless communication memory 12 may be separately provided from each other. It is possible to combine or separate the controller 9, the communication controller 10, and the memory controller 11.

The controller 9, the memory controller 11, and the non-volatile memory 8 operate when the memory card 2 receives power from the electronic device 3. When the memory card 2 receives power via the wireless antenna 7 and does not receive power from the electronic device 3, the controller 9, the memory controller 11, and the non-volatile memory 8 may not necessarily operate. On the other hand, the communication controller 10 is capable of operating even when the memory card 2 receives power via the wireless antenna 7 and does not receive power from the electronic device 3. In other words, when the wireless antenna 7 receives wireless electromagnetic waves of a predetermined frequency which corresponds to the NFC, the communication controller 10 becomes capable of operating, and the memory card 2 becomes capable of performing communication by the NFC.

The non-volatile memory 8 may be non-volatile semiconductor memory, for example. The non-volatile memory is NAND-type flash memory, for example. However, the non-volatile memory 8 may be another non-volatile semiconductor memory, such as a NOR-type flash memory, magnetoresistive random access memory (MRAM), a phase change random access memory (PRAM), a resistive random access memory (ReRAM), a ferroelectric random access memory (FeRAM). For example, the non-volatile memory 8 may be another non-volatile memory, a magnetic memory, or the like. For example, the non-volatile memory 8 may be a three-dimensional structural flash memory.

The non-volatile memory 8 operates when the electronic device 3 supplies power to the memory card 2, for example.

In the present embodiment, the non-volatile memory 8 stores a user ID of a user of the electronic device 3, a password, an electronic device ID, an accessory ID of an accessory which is used in the electronic device 3, a first copy flag, and time data, for example.

For example, an accessory is an accessory of the electronic device 3, which is detachable from and attachable to the electronic device 3. More specifically, the accessory is a keychain, a strap, a medal, a card, or the like. For example, the accessory includes information such as a code or grooves indicating the accessory ID. The accessory ID may be read by the electronic device 3.

The controller 9 receives commands, addresses, and data from the electronic device 3, the memory controller 11, and the communication controller 10.

Based on the received commands, the controller 9 outputs commands, addresses, data, and the like to the memory controller 11, the communication controller 10, and the electronic device 3.

In the present embodiment, the controller 9 may operate based on software such as firmware, an operating system, or an application program.

The controller 9 stores the user ID and password corresponding to the user, the electronic device ID of the electronic device 3 which is used by the user, the accessory ID of the accessory which is used by the electronic device 3, time data of time at which the accessory ID was stored, and the first copy flag in associate with each other in the non-volatile memory 8.

The first copy flag indicates a state of whether or not the group of the user ID, the password, the electronic device ID, the accessory ID, and the time data, which are stored in the non-volatile memory 8, are copied (may also be moved or transferred) to the wireless communication memory 12.

For example, the controller 9 performs mirroring to synchronize at least part of data stored in the non-volatile memory 8 and at least part of data stored in the wireless communication memory 12.

When mirroring target data is stored or updated in one of the non-volatile memory 8 and the wireless communication memory 12, the controller 9 stores or updates the data of the same content in the other memory by the mirroring.

The controller 9 performs the mirroring in a state in which power is being supplied to the memory card 2, for example, in a state in which the user sets the memory card 2 in the electronic device 3. However, even when the electronic device 3 does not supply power to the memory card 2, since the memory card 2 can receive data from the information processing device 4, the controller 9 may be capable of performing the mirroring, for example.

In the present embodiment, the mirroring target data is the user ID, the password, the electronic device ID, the accessory ID, the time data, and the like, for example.

In the present embodiment, the data volume of data that can be stored in the wireless communication memory 12 is less than the data volume of data that can be stored in the non-volatile memory 8. In this case, the controller 9 manages a status which indicates whether or not it is possible to store data in the wireless communication memory 12 based on a position of a vacant region of the wireless communication memory 12, a data volume of the vacant region, the number of accessory IDs which are stored in the wireless communication memory 12, and the like. The controller 9 selects the data to be subjected to the mirroring and performs the mirroring of the selected data from the non-volatile memory 8 to the wireless communication memory 12 when the data capacity of the vacant region is greater than or equal to a predetermined threshold and the wireless communication memory 12 is in a status of being capable of storing data. In the selection of data to be subjected to the mirroring, data (the electronic device ID and the accessory ID) for which the first copy flag is set and of which time data indicates a new time may be preferentially selected, for example.

Accordingly, when it is not possible to mirror all data in the non-volatile memory 8, the controller 9 can select the portion of the data in the non-volatile memory 8 and storing the selected data in the wireless communication memory 12.

When the controller 9 receives an instruction from the information processing device 4, or when the non-volatile memory 8 stores a new accessory ID, for example, the controller 9 may execute the copying of data from the non-volatile memory 8 to the wireless communication memory 12.

The controller 9 may compress the data to be stored in the wireless communication memory 12. The controller 9 may use Hoffman encoding to execute the compression, for example. In that case, when the controller 9 reads the data stored in the wireless communication memory 12, the controller 9 expands the compressed data and outputs the expanded data as read data. The compression and expansion of the data may be executed by the controller 9. Alternatively, the memory card 2 may include a compressor and an expander, and the controller 9 may cause the compressor to compress the data and the expander to expand the data.

The memory controller 11 controls the non-volatile memory 8. The memory controller 11 stores data in the non-volatile memory 8 based on commands and the like from the controller 9, for example. The memory controller 11 reads data from the non-volatile memory 8 and outputs the data to the controller 9 based on commands and the like from the controller 9, for example. The memory controller 11 may directly communicate with the communication controller 10 or the electronic device 3 without communicating with the controller 9.

The wireless antenna 7 is ring-shaped or spiral-shaped, for example. The wireless antenna 7 is a PCB patterned antenna, for example. A frequency band in which the wireless antenna is operable may be a predetermined frequency band corresponding to the NFC.

The wireless antenna 7 is capable of generating power through electromagnetic induction based on electromagnetic waves from the information processing device 4, for example. The wireless antenna 7 supplies the generated power to the communication controller 10.

The wireless antenna 7 receives commands, addresses, and data from the information processing device 4. The wireless antenna 7 outputs the received commands and the like to the communication controller 10.

The wireless antenna 7 is substantially parallel to a substrate 14 of the memory card 2 and is formed on the outer circumferential region of the main surface of the substrate 14.

The non-volatile memory 8, the controller 9, the communication controller 10, and the memory controller 11 are arranged on a predetermined region, for example, a center region of the substrate 14. The wireless antenna 7 surrounds the predetermined region, for example.

The communication controller 10 communicates with the information processing device 4 and the like via the wireless antenna 7. The communication controller 10 receives commands, addresses, data, and the like from the controller 9 and the wireless antenna 7. Based on the received commands, the communication controller 10 outputs the data and the like to the controller 9 and the wireless antenna 7. Based on the received commands, addresses, and the like, the communication controller 10 reads the data from the wireless communication memory 12 and outputs the data to the controller 9 and the wireless antenna 7. The communication controller 10 stores the data in the wireless communication memory 12 based on the received commands, addresses, data, and the like.

The commands, addresses, data, and the like which are communicated among the electronic device 3, the controller 9, the memory controller 11, the communication controller 10, the wireless antenna 7, and the like are not necessarily in the same format. As long as both communicating units are capable of recognizing the commands, addresses, and data, the format may not be the same as the format of the commands, addresses, data, and the like communicated by the other units.

When the communication controller 10 receives a data storage command and data via the controller 9 or the wireless antenna 7, the communication controller 10 stores the data in the wireless communication memory 12. The communication controller 10 may not necessarily perform the writing of the data of the wireless communication memory 12.

The wireless communication memory 12 is non-volatile memory, for example. The wireless communication memory 12 stores data according to the control of the communication controller 10 or the memory controller 11. The storing of data in the wireless communication memory 12 may be temporary. For example, electrically erasable programmable read-only memory (EEPROM) is used as the wireless communication memory 12. However, it is possible to use various memory in the same manner as in the non-volatile memory 8.

In order to operate using the power supplied from the wireless antenna 7, it is desirable for the non-volatile memory used as the wireless communication memory 12 to have a lower per-unit-of-volume power consumption than the non-volatile memory 8. Specifically, NOR-type memory may be used.

In the present embodiment, the wireless communication memory 12 stores a portion of or all of the data stored in the non-volatile memory 8. For example, the wireless communication memory 12 stores the user ID, the password, the electronic device ID, the accessory ID, a second copy flag, a transmission flag, and the time data.

The second copy flag indicates whether or not the group of the user ID, the password, the electronic device ID, the accessory ID, and the time data, which are stored in the wireless communication memory 12, has been copied to the non-volatile memory 8.

The transmission flag indicates whether or not the user ID, the password, the electronic device ID, the accessory ID, and the time data, which are stored in the wireless communication memory 12, have been transmitted to the information processing device 4 by the memory card 2. The transmission flag indicates whether or not the user ID, the password, a terminal device ID, the accessory ID, and the time data, which are stored in the wireless communication memory 12, have been transmitted by the memory card 2 to a server device via the information processing device 4, and whether or not the electronic device ID, the accessory ID, and the time data have been registered in the server device.

The wireless communication memory 12 may store related data of the memory card 2 (a portion of the data stored in the non-volatile memory 8 (for example, image data, audio data (music data, vocal data, and the like), video data, and the like), data relating to the data stored in the non-volatile memory 8, and data relating to the non-volatile memory 8 and the memory card 2), data relating to the information processing device 4, or data relating to the accessory which is mounted to the electronic device 3, and commands which are received from the controller 9, the information processing device 4, or the like.

The voltage wave detector 13 is electrically connected to the wireless antenna 7. The voltage wave detector 13 detects voltage of power supplied from the wireless antenna 7 to the communication controller 10. The voltage wave detector 13 outputs a reset command of the communication by the NFC until a predetermined voltage sufficient for the communication controller 10 to operate is reached. While the communication controller 10 receives the reset command, the communication controller 10 does not perform communication by the NFC. Using this reset command, it is possible to prevent abnormal startup and operation of communication by the NFC. When the predetermined voltage is reached, the voltage wave detector 13 may output an operation capable command to the communication controller 10. In this case, the communication controller 10 performs the communication by the NFC only when the operation capable command is being received.

The connection terminals 2*a* are standardized terminals, for example, and are capable of being electrically connected to the slot connection terminals 5*a* of the slot device 1.

Figure 4:
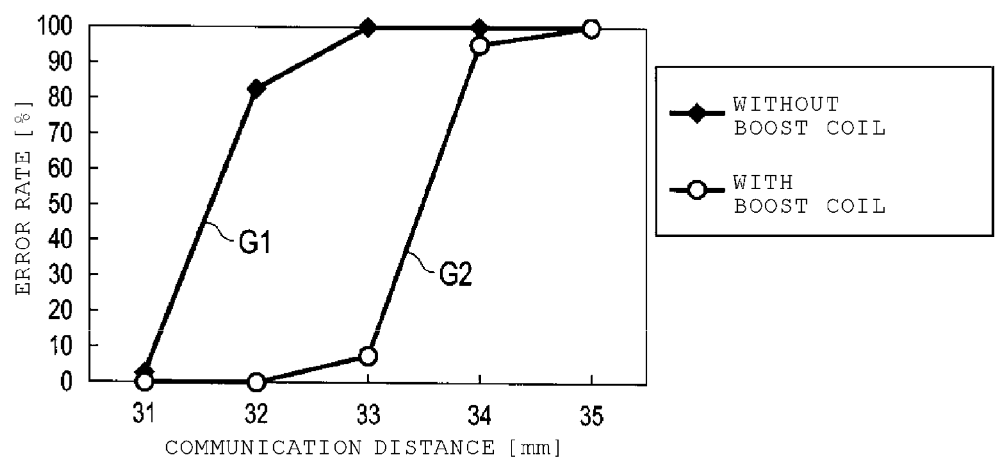
FIG. 4 is a graph illustrating a relationship between an error rate and a communication distance in a case in which a boost coil according to the first embodiment is used and a case in which the boost coil is not used.

FIG. 4 is a graph illustrating a relationship between an error rate and a communication distance of a case in which the boost coil 6 according to the present embodiment is used and a case in which the boost coil 6 is not used.

In FIG. 4, the vertical axis indicates the error rate and the horizontal axis indicates the communication distance. In a graph G1 representing the case in which the boost coil 6 is not used, the error rate increases as the communication distance increases. In comparison, in a graph G2 representing the case in which the boost coil 6 is used, the error rate does not increase much, as the communication distance increases to a certain length (e.g., 33 mm in FIG. 4).

Figure 5:
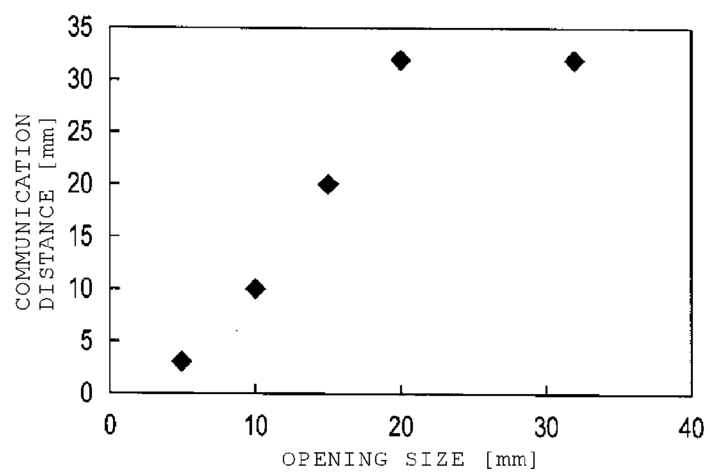
FIG. 5 is a graph illustrating a relationship between the opening size of a slot of the memory card slot device and the communication distance.

FIG. 5 is a graph illustrating the relationship between the opening size of the slot 5 and the communication distance.

In FIG. 5, the vertical axis indicates the communication distance and the horizontal axis indicates the opening size. The opening size in FIG. 5 represents the distance from the end portion 2*b* of the memory card 2 in the pull-out direction D2 to the end portion 5*g* of the slot 5 in the pull-out direction D2 in which the opening region 5*e* is formed in the first main surface 5*c* of the slot 5 when the memory card 2 is mounted in the slot 5.

When the opening size of the slot 5 is less than 20 mm, as the opening size increases, the communication distance increases. For that reason, it is preferable to set the opening size to greater than or equal to 20 mm. Meanwhile, once the opening size is greater than or equal to 20 mm, even if the opening size increases, the communication distance does not change (increase). That is, the communication distance at the opening size of 30 mm is approximately the same as the communication distance at the opening size of 20 mm. For that reason, the opening size is preferably in a range from 20 mm to 30 mm.

In the present embodiment described above, the boost coil 6 is provided between the surface 3*a* of the electronic device 3 and the slot 5.

Because of the boos coil 6, it is possible to extend the communication distance between the memory card 2 mounted in the slot device 1 and the information processing device 4. As a result, it is possible to reduce the error rate between the memory card 2 mounted in the slot device 1 and the information processing device 4, and improve the communication performance.

In the present embodiment, the opening region 5*e* is formed in the first main surface 5*c* of the slot 5 so as to be opened by greater than or equal to 20 mm from the end portion 2*b* of the memory card 2 in the pull-out direction D2 to the end portion 5*g* of the slot 5 in the pull-out direction D2 in which the opening region 5*e* is formed in the first main surface 5*c* of the slot 5 in a state in which the memory card 2 is mounted in the slot 5.

As a result, it is possible to extend the communication distance between the memory card 2 mounted in the slot device 1 and the information processing device 4.

In the present embodiment, the electronic device 3 includes the slot device 1 such that the distance between the surface 3*a* of the electronic device 3 and the memory card 2 mounted in the slot 5 is 20 mm or less.

As a result, it is possible to perform wireless communication between the memory card 2 mounted in the slot device 1 and the information processing device 4.

In the present embodiment, the slot 5 is formed of a non-metal material, a highly magnetically permeable material, or a non-magnetic material.

As a result, it is possible to prevent the performance of the wireless communication between the memory card 2 mounted in the slot device 1 and the information processing device 4 from deteriorate because of the slot 5, and it is possible to extend the communicable range of the memory card 2.

In the present embodiment described above, first to fourth configurations are combined in order to prevent the communication performance of the memory card 2 having the wireless communication function from deteriorating. As the first configuration, the boost coil 6 is provided. As the second configuration, the distance between the end portion 2*b* of the memory card 2 and the end portion 5*g* in the opening region 5*e* of the first main surface 5*c* of the slot 5 in a state in which the memory card 2 is inserted in the slot 5 is greater than or equal to 20 mm. As the third configuration, the electronic device 3 includes the slot device 1 such that the distance from the memory card 2 which is mounted in the slot 5 to the surface 3*a* of the electronic device 3 is 20 mm or less. As the fourth configuration, the slot 5 is formed of a non-metal material, a highly magnetically permeable material, or a non-magnetic material. However, the present embodiment may use one or more of the plurality of configurations.

For example, the opening portion may not be formed in the slot 5 and the slot 4 may be shaped to cover the mounted memory card 2. Even in this case, according to one or more of the first, third, and fourth configurations, it is possible to prevent the performance of the wireless communication from deteriorating.

For example, the slot 5 may be formed of metal. Even in this case, according to one or more of the first to third configurations, it is possible to prevent the communication performance from deteriorating.

For example, the distance from the memory card 2 mounted in the slot 5 to the surface of the electronic device 4 may exceed 20 mm. Even in this case, according to one or more of the first, second, and fourth embodiments, it is possible to properly perform the wireless communication between the information processing device 4 and the memory card 2.

(Second Embodiment)

In the present embodiment, a specific example of the boost coil 6 according to the first embodiment will be described.

Figure 6:
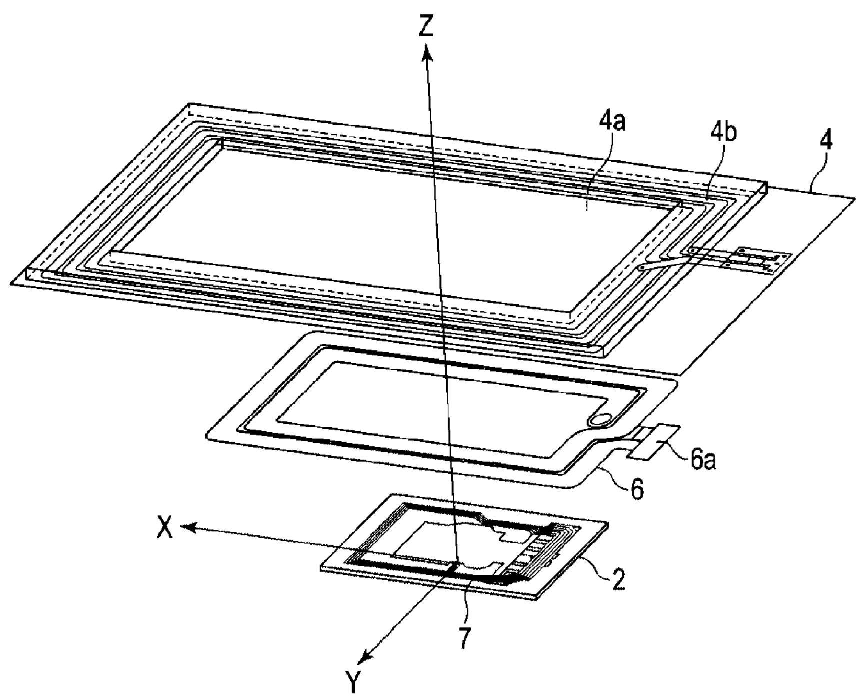
FIG. 6 is an exploded view of the memory card, the boost coil, and a reader-writer according to a second embodiment.

FIG. 6 is an exploded diagram of the memory card 2, the boost coil 6, and a reader-writer 4*a* of the information processing device 4 according to the present embodiment. In FIG. 6, the memory card 2, the boost coil 6, the reader-writer 4*a* of which the information processing device 4, and a capacitor 6*a* of the boost coil 6 are depicted, and other constituent elements are omitted.

The reader-writer 4*a* includes a wireless antenna 4*b* which is ring shaped or spiral shaped.

The X axis extends in the pull-out direction D2 in the first embodiment. The Y axis is perpendicular to the X axis. A plane represented by the X axis and the Y axis is parallel to the main surface of the substrate 14 of the memory card 2. The Z axis is perpendicular to the X axis and the Y axis and extends in the direction perpendicular to the surface 3*a* of the electronic device 3.

The memory card 2, the boost coil 6, and the wireless antenna 4*b* of the reader-writer 4*a* face each other. The boost coil 6 is arranged between the memory card 2 and the wireless antenna 4*b*. The capacitor 6*a* of the boost coil 6 is formed such that the frequency of the electromagnetic waves becomes a predetermined frequency (for example, 13.56 MHz of the NFC).

The size of the boost coil 6 is larger than the size of the wireless antenna 7 of the memory card 2, and smaller than the size of the wireless antenna 4*b* of the reader-writer 4*a*.

Figure 7:
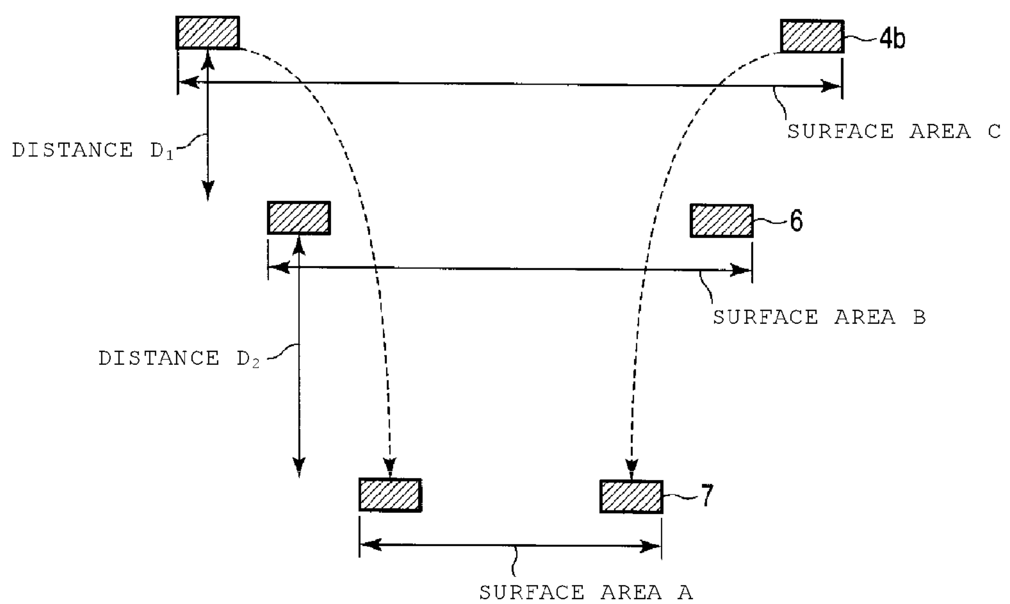
FIG. 7 is a cross-sectional view of a wireless antenna of the memory card, the boost coil, and a wireless antenna of the reader-writer according to the second embodiment.

FIG. 7 is a cross-sectional diagram illustrating a positional relationship among the wireless antenna 7 of the memory card 2, the boost coil 6, and the wireless antenna 4*b* of the reader-writer 4*a* according to the second embodiment. FIG. 7 illustrates a cross section parallel to the Z axis in FIG. 6 that crosses the wireless antenna 7 of the memory card 2, the boost coil 6, and the wireless antenna 4*b* of the reader-writer 4*a*.

In FIG. 7, surface areas A to C (measured in $mm^2$ units, for example) of the insides of the outer circumferences of the wireless antenna 7, the boost coil 6, and the wireless antenna 4*b* of the reader-writer 4*a* are assumed to be the sizes of the wireless antenna 7, the boost coil 6, and the wireless antenna 4*b* of the reader-writer 4*a*, respectively.

In the present embodiment, the sizes of the wireless antenna 7, the boost coil 6, and the wireless antenna 4*b* have the relationship $A<B<C$. Due to this relationship, the magnetic flux which travels from the wireless antenna 4*b* of the reader-writer 4*a* converges toward the wireless antenna 7 of the memory card 2, which leads to extension of communicable distance between the wireless antenna 7 and the wireless antenna 4*b*.

For example, the size A of the wireless antenna 7 of the memory card 2 may be set to 20 mm×28 mm, the size B of the boost coil 6 may be set to 22 mm×35 mm, and the size C of the wireless antenna 4*b* of the reader-writer 4*a* may be set to 36 mm×56 mm.

It is preferable that a distance $D_1$ between the wireless antenna 4*b* and the boost coil 6 is lesser than a distance $D_2$ between the boost coil 6 and the wireless antenna 7. That is, it is preferable that the boost coil 6 is closer to the surface 3*a* of the electronic device 3 than the wireless antenna 7. When the distance $D_2$ between the wireless antenna 7 and the boost coil 6 is too close, resonance may occur between the wireless antenna 7 and the boost coil 6 and the frequency may be shifted. Due to the relationship of distance $D_1$<distance $D_2$, it is possible to prevent the resonance from occurring between the wireless antenna 7 and the boost coil 6.

Figure 8:
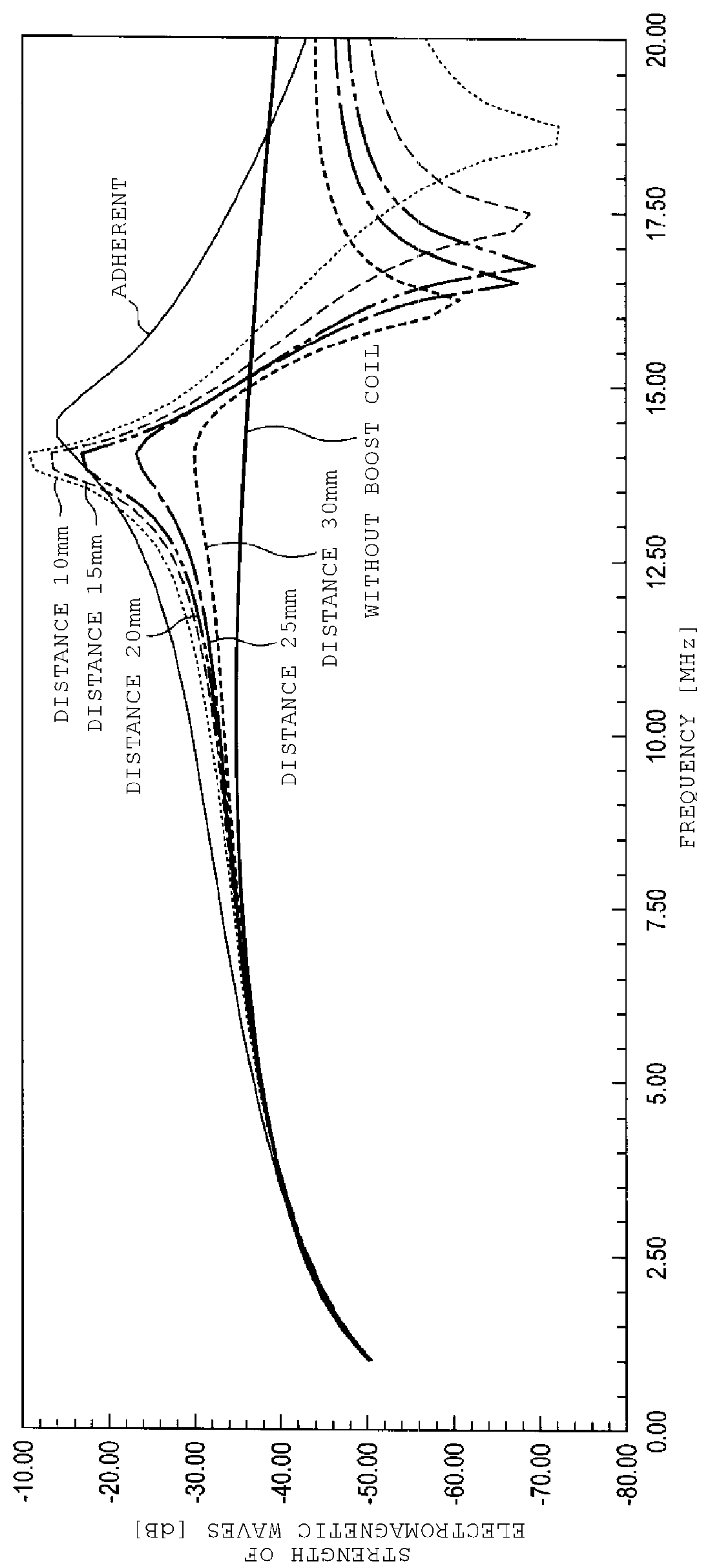
FIG. 8 is a graph illustrating a relationship between the distance between the memory card and the boost coil, the strength of the electromagnetic waves, and the frequency when a boost coil according to the second embodiment is used.

FIG. 8 is a graph illustrating a relationship between the distance between the memory card 2 and the boost coil 6, the strength of the electromagnetic waves, and the frequency when the boost coil 6 according to the second embodiment is used.

In FIG. 8, the vertical axis is the strength of the electromagnetic waves in dB, and the horizontal axis represents the frequency in MHz.

FIG. 8 represents the relationship between the strength of the electromagnetic waves and the frequency in cases in which the distance between the memory card 2 and the boost coil 6 is 0 mm (adhering), 10 mm, 15 mm, 20 mm, 25 mm, and 30 mm.

The relationship shown in FIG. 8 indicates that it is possible to perform communication with stronger electromagnetic waves as the distance between the memory card 2 and the boost coil 6 decreases. By using the boost coil 6, it is possible to obtain a boosting effect of the electromagnetic waves, and communication is possible even if the distance from the memory card 2 is great.

In this manner, due to the electronic device 3 including the boost coil 6 of a size larger than the size of the wireless antenna 7 of the memory card 2 and smaller than the size of the wireless antenna 4*b* of the reader-writer 4*a*, it is possible to perform communication with strong electromagnetic waves. Further, communication can be performed between the memory card 2 and the information processing device 4 even if the distance between the memory card 2 and the information processing device 4 is great.

Figure 9:
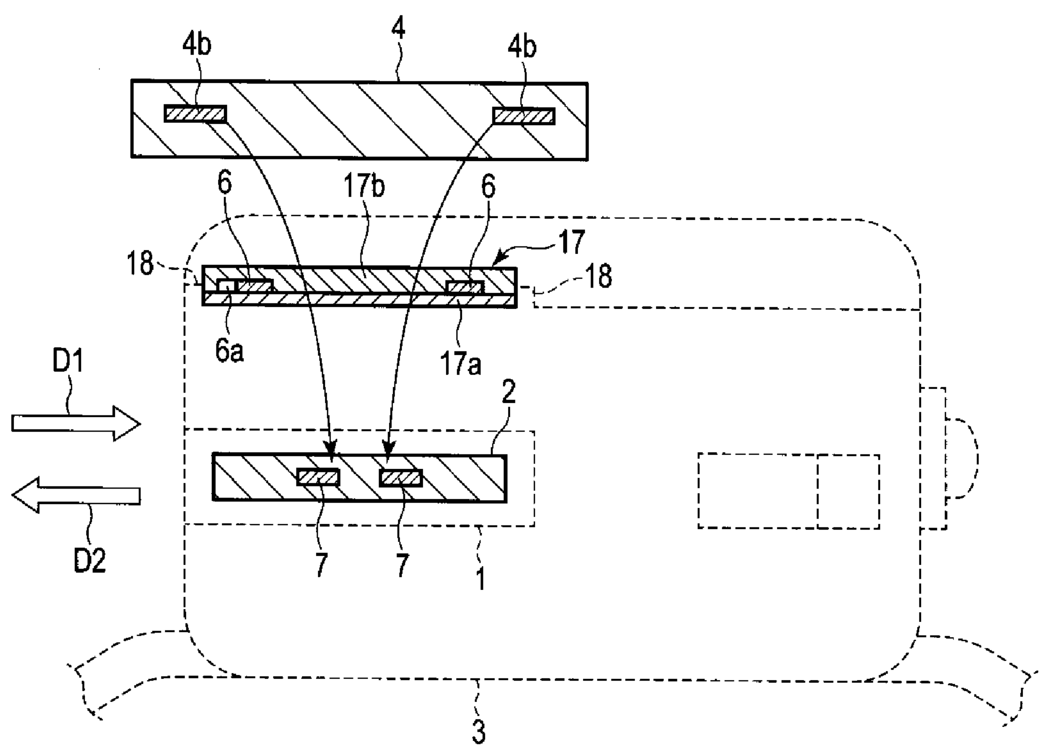
FIG. 9 is a cross-sectional view of the boost coil mounted on the electronic device according to the second embodiment.

FIG. 9 is a cross-sectional diagram illustrating an example of the boost coil 6 disposed in the electronic device 3. FIG. 9 illustrates a cross section which is parallel to the insertion direction D1 and the pull-out direction D2 of the memory card 2.

Figure 10:
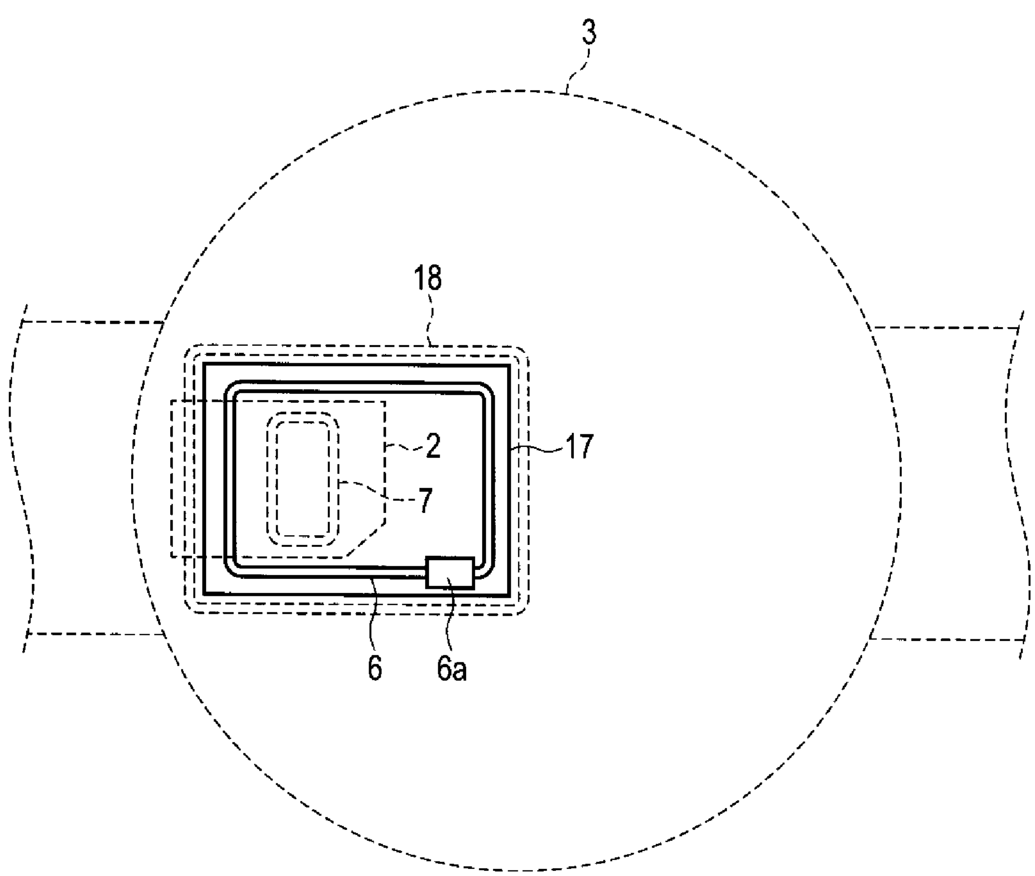
FIG. 10 is a top view of the boost coil mounted on the electronic device according to the second embodiment.

FIG. 10 is a transparent view of the electronic device 3 in which the boost coil 6 is inserted.

In FIGS. 9 and 10, the electronic device 3 is depicted using dashed lines. In FIGS. 9 and 10, an adhesive body 17 (for example, a seal, a sticker, a decal, or a label) including the boost coil 6 and the capacitor 6*a* is bonded to the electronic device 3. The adhesive body 17 includes the boost coil 6 and the capacitor 6*a* on top of an adhesive layer 17*a*, and includes a covering body 17*b* on top of the adhesive layer 17*a*, the boost coil 6, and the capacitor 6*a*. The covering body 17*b* may be paper, synthetic resin, rubber, or the like, for example. At the time of usage, the adhesive body 17 is peeled from a peeling body and bonded to the electronic device 3.

The electronic device 3 includes a mark 18 indicating a position to bond the adhesive body 17. The mark 18 may be a frame, a symbol, a marker, a label, or a pattern, and may be a groove, a protruding portion, or the like.

The size of the boost coil 6 may be greater than the size of the wireless antenna 7 of the memory card 2 and less than or equal to three times the size of the wireless antenna 7. According to this relationship between the size of the boost coil 6 and the size of the wireless antenna 7 of the memory card 2, the magnetic flux of the boost coil 6 can converge, and it is possible to extend the communicable distance.

In this manner, by bonding the adhesive body 17 to the electronic device 3, it is possible to easily mount the boost coil 6 on the electronic device 3. As a result, it is possible to prevent the design and the manufacturing of the electronic device 3 from becoming complicated.

(Third Embodiment)

In the present embodiment, modification examples of the slot device 15 according to the first and second embodiments will be described.

Figure 11:
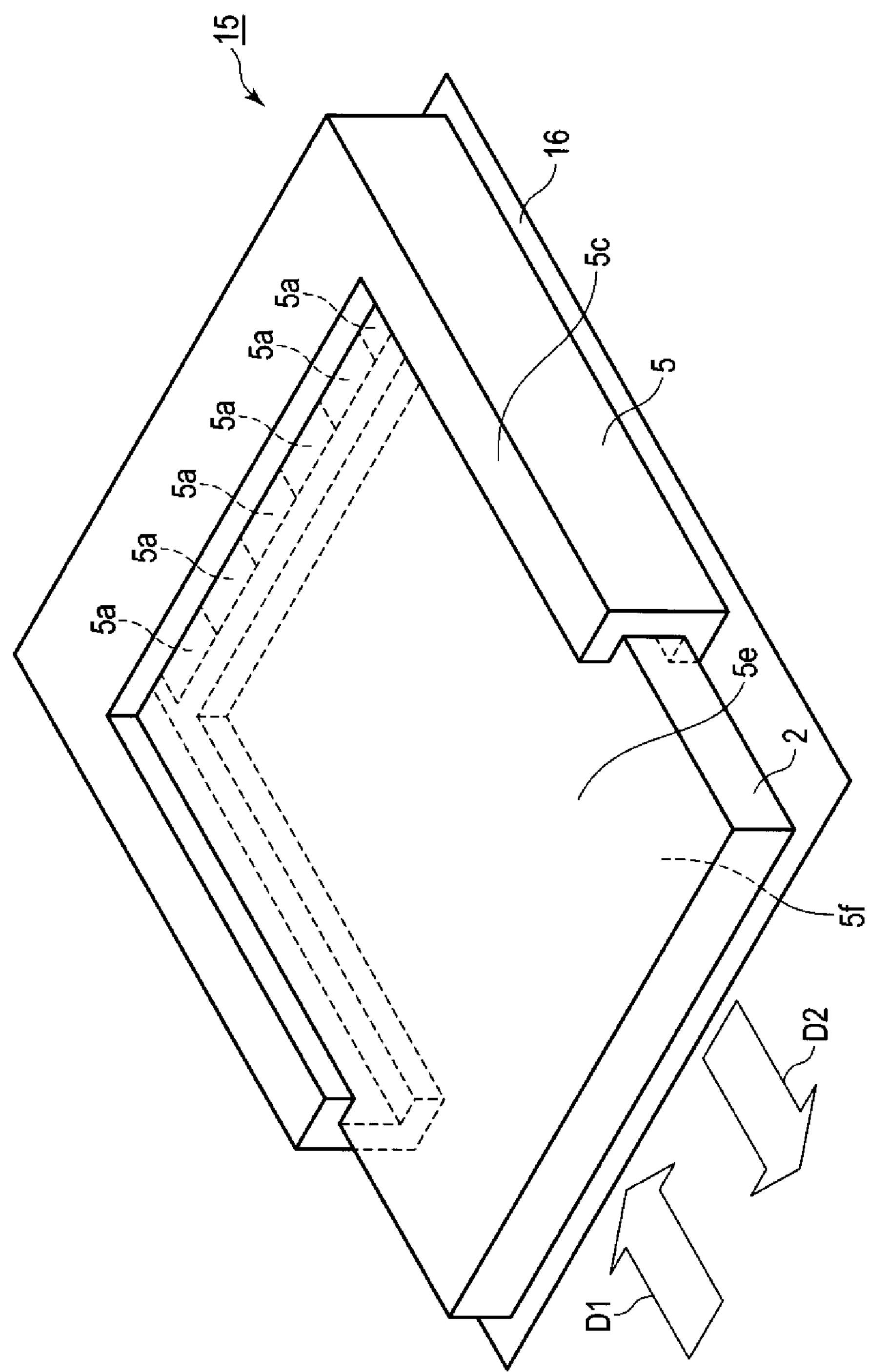
FIG. 11 is a perspective diagram of a memory card slot device according to a first example of a third embodiment.

FIG. 11 is a perspective view of a slot device 15 according to a first example of the present embodiment.

In the slot device 15 according to the present example, a magnetic body 16, which faces the second main surface 5*d*, is provided on the outside of the second main surface 5*d* of the slot 5. The first main surface 5*c* and the second main surface 5*d* of the slot 5 include the opening regions 5*e* and 5*f*, respectively.

The magnetic body 16 may be sheet-shaped, for example. The magnetic body 16 is formed of a magnetic material, has high magnetic permeability, and has low magnetic loss. An electromagnetic wave absorbing body may be used instead of the magnetic body 16.

Figure 12:
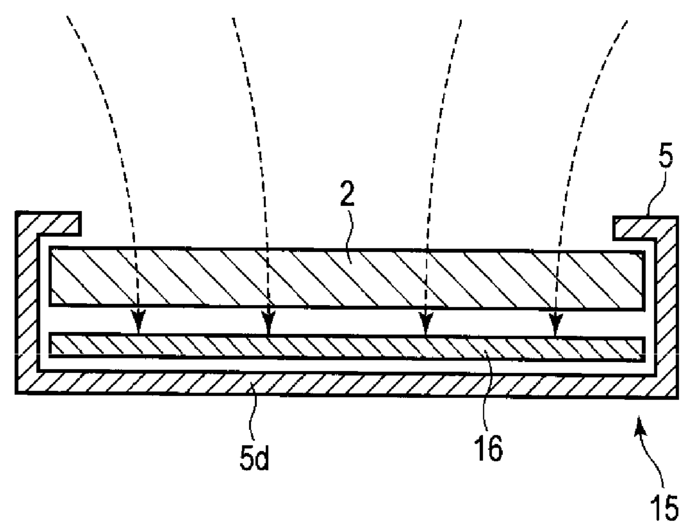
FIG. 12 is a cross-sectional diagram of a memory card slot device according to a second example of the third embodiment.

FIG. 12 is a cross-sectional diagram of the slot device 1 according to a second example of the present embodiment. The cross-sectional diagram of FIG. 12 illustrates a cross section which is perpendicular to the insertion direction D1 and the pull-out direction D2 of the memory card 2 in the same manner as FIG. 2.

The slot device 15 includes the magnetic body 16 on the second main surface 5*d*.

According to the slot device 15 of the first and second examples shown in FIGS. 11 and 12, when the memory card 2 is mounted in the slot device 15, the magnetic body 16 receives the magnetic flux emitted from the reader-writer 4*a* of the information processing device 4 via the memory card 2.

According to the present embodiment, the magnetic flux can effectively passes through the wireless antenna 7 of the memory card 2, and it is possible to prevent an eddy current from being generated between the wireless antenna 7 of the memory card 2 and a metal body of the electronic device 3.

In this manner, by disposing the magnetic body 16 between the memory card 2 and the metal body of the electronic device 3, it is possible to remove the eddy current and noise in the wireless communication between the memory card 2 and the information processing device 4, and improve the communication environment. As a result, it is possible to extend the communicable distance of the memory card 2.

The present embodiment can be employed in combination with at least one of the first to fourth configurations in the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device, comprising:
- a main body having an upper surface and an aperture at a side surface thereof;
- a slot member disposed in the main body, the slot member having a slot that is exposed by the aperture and into which a memory card of a predetermined size is insertable and a connection terminal electrically connectable to a connection terminal of the memory card; and
- a coil disposed on the upper surface of the main body or within the main body, and extending in a plane between the upper surface and the slot member so as to overlap most of the outer periphery of the slot into which the memory card is to be inserted and amplify an intensity of electromagnetic waves transmitted from a wireless communication device to a wireless antenna of the memory card when a wireless antenna of the wireless communication device is placed over the upper surface of the main body and the memory card is inserted into the slot.

2. The electronic device according to claim 1, wherein the coil is disposed so as to amplify an intensity of electromagnetic waves transmitted from the wirelessly-communicable memory card when the wirelessly-communicable memory card is inserted in the slot.

3. The electronic device according to claim 1, wherein the coil is disposed such that an entire plane area of the slot wireless antenna overlaps with a plane area defined by the coil.

4. The electronic device according to claim 1, wherein the slot member has an opening that exposes the memory card to a plane area defined by the coil when the memory card is inserted in the slot.

5. The electronic device according to claim 4, wherein the opening is formed such that an exposed region of the memory card has a length equal to or greater than 20 mm in an insertion direction of the memory card.

6. The electronic device according to claim 4, wherein the opening has a length equal to or greater than 20 mm in an insertion direction of the memory card.

7. The electronic device according to claim 1, further comprising:
- a magnetic member disposed outside the slot member so as to face a surface of the slot member that is opposite to the surface thereof facing the coil.

8. The electronic device according to claim 1, further comprising:
- a magnetic member disposed in the slot of the slot member so as to face the memory card when the memory card is inserted.

9. The electronic device according to claim 1, wherein a main portion of the slot member is formed of a non-metallic material.

10. The electronic device according to claim 1, wherein the coil is formed on a surface of an adhesive member that is attached to the upper surface of the main body.

11. The electronic device according to claim 1, wherein a distance between the upper surface of the main body and the surface of the slot member is equal to or smaller than 20 mm.

12. An electronic device, comprising:
- a main body having an upper surface and an aperture at a side surface thereof; and
- a slot member disposed in the main body, the slot member having a slot that is exposed by the aperture and in which a wirelessly-communicable memory card of a predetermined size is insertable and a connection terminal electrically connectable to a connection terminal of the wirelessly-communicable memory card, wherein
- the aperture is formed such that a side surface of the wirelessly-communicable memory card is exposed therein, when the wirelessly-communicable memory card is inserted in the slot, and
- the slot member has an opening that exposes the wirelessly-communicable memory card when the wirelessly-communicable memory card is inserted in the slot, the opening being formed such that an exposed region of the wirelessly-communicable memory card has a length equal to or greater than 20 mm in an insertion direction of the wirelessly-communicable memory card.

13. The electronic device according to claim 12, wherein the opening has a length equal to or greater than 20 mm in an insertion direction of the wirelessly-communicable memory card.

14. The electronic device according to claim 12, further comprising:
- a magnetic member disposed outside the slot member so as to face a surface of the slot member.

15. The electronic device according to claim 12, further comprising:

a magnetic member disposed in the slot of the slot member so as to face the wirelessly-communicable memory card when the wirelessly-communicable memory card is inserted.

16. The electronic device according to claim 12, wherein a main portion of the slot member is formed of a non-metal material.

17. The electronic device according to claim 12, wherein a distance between a surface of the main body and a surface of the slot member is equal to or smaller than 20 mm.

18. The electronic device according to claim 12, further comprising:

a coil disposed on the upper surface of the main body or within the main body, and extending in a plane between the upper surface and the slot member so as to overlap most of the outer periphery of the slot into which the memory card is to be inserted and amplify an intensity of electromagnetic waves transmitted from a wireless communication device to a wireless antenna of the memory card when a wireless antenna of the wireless communication device is placed over the upper surface of the main body and the memory card is interested into the slot, wherein a plane area defined by the coil is larger than a plane area of the wirelessly-communicable memory card of the predetermined size.

19. The electronic device according to claim 18, wherein the surface of the main body has an alignment mark along which the coil is disposed.

* * * * *